United States Patent [19]
Tung et al.

[11] Patent Number: 5,682,060
[45] Date of Patent: Oct. 28, 1997

[54] PROCESS FOR MANUFACTURING INTEGRATED CIRCUIT CAPACITORS AND RESISTORS AND THE CAPACITORS AND RESISTORS

[75] Inventors: Yingsheng Tung, Plano; Robert E. Dixon, Garland, both of Tex.

[73] Assignee: Texas Instruments Incorporated, Dallas, Tex.

[21] Appl. No.: 427,474

[22] Filed: Apr. 24, 1995

Related U.S. Application Data

[63] Continuation of Ser. No. 197,438, Feb. 16, 1995, abandoned.

[51] Int. Cl.$^6$ .................. H01L 29/00; H01L 23/48; H01L 29/40
[52] U.S. Cl. .................. 257/533; 257/754; 437/200; 437/918; 437/919
[58] Field of Search .................. 257/295, 532, 257/533, 535, 755, 754, 756; 437/200, 919, 918, 60, 47

[56] References Cited

U.S. PATENT DOCUMENTS

| | | | |
|---|---|---|---|
| 4,329,706 | 5/1982 | Crowder et al. | 257/755 |
| 4,553,050 | 11/1985 | Feinberg et al. | 257/533 |
| 4,914,546 | 4/1990 | Alter | 361/313 |
| 5,037,772 | 8/1991 | McDonald | 257/535 |
| 5,187,122 | 2/1993 | Bonis | 437/200 |
| 5,250,456 | 10/1993 | Bryant | 437/200 |
| 5,266,156 | 11/1993 | Nasr | 437/200 |

FOREIGN PATENT DOCUMENTS

| | | | |
|---|---|---|---|
| 57-73965 | 5/1982 | Japan | 257/532 |
| 4-73960 | 3/1992 | Japan | 257/532 |

*Primary Examiner*—J. Carroll
*Attorney, Agent, or Firm*—Paul C. Hashim; W. J. Brady, III; R. L. Donaldson

[57] ABSTRACT

A method of making an integrated circuit capacitor and/or resistor and the capacitor and/or resistor wherein the method comprises providing an electrically conductive region, preferably highly doped silicon, forming a first electrode of a capacitor, forming a layer of electrically insulating material, preferably silicon oxide, silicon nitride or a combination thereof, over the surface and forming a layer of a metal silicide, preferably titanium silicide, over the layer of electrically insulating material by forming a layer of polysilicon over the layer of electrically insulating material, forming a layer of a metal, preferably titanium, which forms an electrically conductive composition when reacted with polysilicon over the layer of polysilicon, reacting the metal with the polysilicon to form an electrically conductive layer therewith and removing any unreacted metal. In accordance with a second embodiment, wherein both capacitor electrodes are accessible from one side of the capacitor, a portion of the first electrode is exposed and the layer of a metal silicide extends to and contacts the exposed portion of the first electrode. The portion of the layer of metal silicide contacting the first electrode is electrically isolated from a predetermined other portion of the layer of metal silicide which is disposed over the region to form a second electrode.

7 Claims, 2 Drawing Sheets

PROCESS FOR MANUFACTURING INTEGRATED CIRCUIT CAPACITORS AND RESISTORS AND THE CAPACITORS AND RESISTORS

This application is a Continuation of application Ser. No. 08/197,438, filed Feb. 16, 1995 abandoned.

CROSS REFERENCE TO RELATED APPLICATIONS

This application is related to Ser. No. 08/197,439 pending, filed concurrently herewith (TI-17413) entitled PROCESS FOR MANUFACTURING INTEGRATED CIRCUIT CAPACITORS AND RESISTORS AND THE CAPACITORS AND RESISTORS, the contents of which are incorporated herein by reference.

BACKGROUND OF THE INVENTION

1. Field of the Invention

This invention relates to a method of manufacturing integrated circuit capacitors and/or resistors and the resulting capacitors and/or resistors.

2. Brief Description of the Prior Art

Integrated circuit capacitors, which are generally any two layers of electrical conductor with a dielectric therebetween, are generally disposed either (1) over active devices in the active device or moat regions of the integrated circuit, in which case the capacitors can be separate components or share structure with active component or (2) separated from the active device or moat region in which case such capacitors are generally disposed over the field oxide separating the active device or moat regions.

Integrated circuit capacitors as presently provided generally include either a portion of substrate silicon which has been doped or a doped polycrystalline silicon (polysilicon) layer with a dielectric thereover with the upper capacitor plate formed of metal, such as part of the metal interconnect or a thin (about 2K to 3 KÅ) polysilicon film forming the upper plate. Such thin film polysilicon capacitor plates are difficult to dope to high dopant concentrations and thus are not highly electrically conductive. The polysilicon films of such prior art capacitors are generally doped by ion implant or with phosphorous, generally $POCl_3$. Consequently, the voltage coefficient of such capacitors tends to be poor in that the capacitors cannot hold their value when the bias thereacross changes because of formation of a space charge layer with the polysilicon film. Also, when a low quality dielectric is used, the frequency performance is degraded. This limits the performance of the circuits that employ such capacitors as circuit elements.

High performance circuits which require linearity in the range of about 14 bits and higher generally require a precision capacitor. Such capacitors are of much higher quality than those generally fabricated in state of the art integrated circuits by the standard state of the art techniques.

It is therefore apparent that the quality of the capacitor plates and dielectric must be improved.

SUMMARY OF THE INVENTION

In accordance with the present invention, the quality of the silicon or polysilicon/dielectric, preferably a good oxide/polysilicon capacitor is improved by improving the upper capacitor plate thereof. This is accomplished by complete silicidization of the thin polysilicon film which makes up the upper plate of the capacitor, preferably with titanium, thereby eliminating the potential formation of a space charge layer within the polysilicon film and improving the voltage coefficient of the capacitor. This causes the upper plate of the capacitor to operate substantially as if it were a metal.

This is accomplished by first providing a silicon substrate, forming a layer of oxide greater than 5500 Å and preferably about 6000 Å thereover, preferably by thermal growth. A layer of first polysilicon from about 3000 Å to about 4000 Å and preferably about 3500 Å is then deposited over the oxide layer and doped with a dopant, preferably phosphorous 31 implant, to a level of about 1 to $2 \times 10^{16}$ ions/cm$^2$ and/or $POCl_3$ doping in a furnace tube to a 14 ohm/square level when used as a capacitor plate. The first polysilicon layer is then patterned and etched in standard manner to leave a heavily doped section of polysilicon which will be the bottom plate of the capacitor. At any time in the procedure, any active or passive elements will be fabricated in the active or moat regions of the device being processed in standard manner at an appropriate time in the process. Such fabrication steps will take place separately or concurrently with the processing of the capacitor, this depending upon the processing steps involved and if the same processing steps are called for both for component fabrication in the active or moat region and for capacitor fabrication.

At this time, the capacitor dielectric is deposited in the form of an oxide or oxide/nitride/oxide having a thickness dependent upon the desired capacitance value. This dielectric material is subsequently patterned using standard lithography techniques. A layer of second polysilicon which is as thin as possible while still being adequately electrically conductive to provide the required capacitance and having a thickness of from about 900 Å to about 2000 Å and preferably about 1200 Å is then deposited in standard manner over the entire surface of the substrate including over the capacitor dielectric, this layer to result in the upper capacitor plate. As a first alternative, the surface of the device being fabricated can be patterned and masked with the second polysilicon layer being deposited only in the patterned regions, this including the capacitor dielectric, and the mask is removed. As a second alternative, the surface of the device being fabricated can be coated with the second polysilicon layer, masked and etched and the mask is then removed. A layer of metal that reacts with silicon to provide an electrical conductor without degrading the remainder of the device, preferably titanium, of sufficient thickness to completely silicide the second polysilicon layer, is then deposited over the entire device and the device is then heated to a temperature of about 675° C.±5° C. for 30 minutes to cause a silicide to form (titanium silicide in the preferred embodiment) in those locations where the metal rests over the second polysilicon, this including the top capacitor plate. The remaining titanium lies on the surface of the device being fabricated in unreacted state and is then removed with a mixture which is 6 parts deionized water, 2 parts hydrogen peroxide (30%) and 1 part ammonium hydroxide (28%) which reacts with the elemental metal (titanium) but not with the silicide (titanium silicide) in standard manner. The result is a capacitor disposed either in the active region or over the field oxide or both with relatively highly electrically conductive lower and upper plates, despite having a thin upper plate as in the prior art.

In accordance with a second embodiment of the invention, an integrated circuit capacitor is disposed on the field oxide wherein both capacitor plates extend to the upper surface of the capacitor and are both accessible therefrom. In this embodiment, the bottom capacitor plate and the dielectric are formed as in the first embodiment. However, the dielectric is then etched so that a portion of the first polysilicon layer is exposed. Accordingly, when the second polysilicon layer is deposited, it extends to and contacts the lower capacitor plate. The second polysilicon layer is then etched to separate the upper plate portion into two sections, one contacting the lower plate and the other isolated from the lower plate. The lower plate now extends around the dielectric layer to the upper surface. Siliciding with the titanium then takes place as in the first embodiment.

Advantages derived from the invention are that the silicided polysilicon film does not deplete under normal voltage bias conditions. Capacitors made of such film have a lower voltage coefficient. Integrated circuits that use such a capacitor as a circuit element can achieve higher performance. In addition, the polysilicon silicidation process of the present invention is a part of the standard CMOS processes. No extra process step is required for this invention, thus making it cost effective. Furthermore, the thermal budget of the above described process is lowered because no additional process step is required. This makes the capacitor easily adaptable to process flows that have limited thermal budget. Also, the process is robust in that silicidation is self-limiting. By comparison, both ion implant and $POCl_3$ doping require precision control and thus are more prone to suffering from yield loss.

As a further embodiment, the first polysilicon layer is doped to a level to provide a predetermined resistance after this layer has been later patterned and etched to provide a predetermined geometry to provide the desired resistance. This layer can then act as a resistor and/or a capacitor plate.

As a still further embodiment, the second polysilicon layer can be patterned to provide a predetermined resistance commensurate with the patterned geometry. This can be accomplished in conjunction with the patterning of the first polysilicon layer as described above or without such patterning. The second polysilicon layer can thereby operate as a resistor as well as a capacitor plate.

It follows that the first polysilicon layer can operate as a capacitor plate only, a resistor only or both a capacitor plate and a resistor simultaneously. Also, the second polysilicon layer can operate as a capacitor plate only, a resistor only or both a capacitor plate and a resistor simultaneously. Any one of the possible operations of the first and second polysilicon layers can be provided simultaneously by each of the layers.

BRIEF DESCRIPTION OF THE DRAWINGS

FIGS. 1b'-1d' are a process flow relating to formation of transistors in the active region of the device, in accordance with the present invention.

DESCRIPTION OF THE PREFERRED EMBODIMENT

Figure 1A:
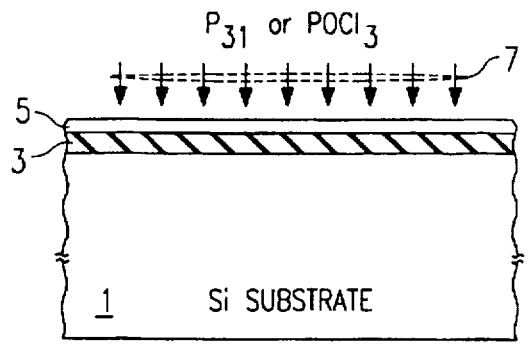
FIGS. 1a to 1c are a process flow in accordance with a first embodiment of the present invention.
Figures 1, 1B:
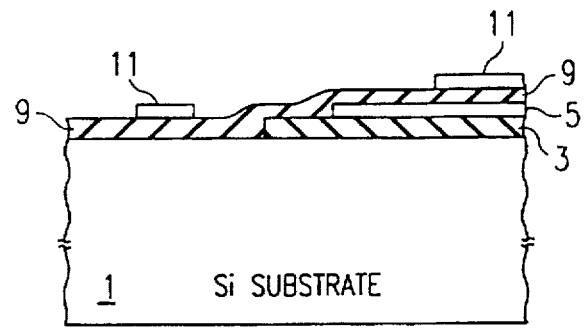
Figure 1B:
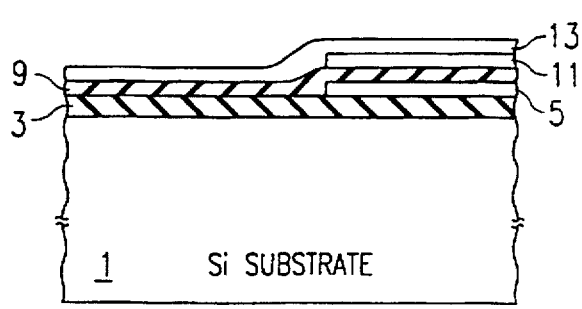

A capacitor in accordance with the present invention is fabricated, with reference to FIG. 1a, by first providing a silicon substrate 1, forming a layer of oxide 3 which is 6 KÅ thick thereover, such as by thermal growth. A layer of polysilicon 5 which is 3.5 KÅ thick is then deposited over the oxide layer 3 and doped with a phosphorous 31 implant 7 to a level of about 1 to $2 \times 10^{16}$ ions/cm$^2$ or $POCl_3$ deposition to 14 ohms/square. The polysilicon layer 5 is then patterned and etched in standard manner to leave a heavily doped section of polysilicon 5 as shown in FIG. 1b which will be the bottom plate of the capacitor. At this time in the procedure, any active or passive elements will be fabricated in the active or moat regions of the device being fabricated in standard manner. Such fabrication steps will take place separately or concurrently with the processing of the capacitor, this depending upon the processing steps involved and if the same processing steps are called for for both component fabrication in the active or moat region and for capacitor fabrication.

Figures 1, 1C:
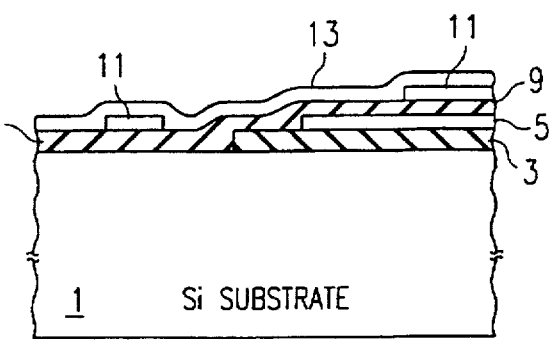
Figure 1C:
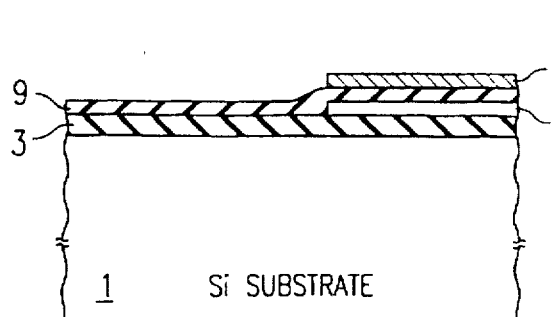

At this time, as shown in FIG. 1b, the capacitor dielectric 9 is deposited in the form of an oxide or oxide/nitride/oxide having a thickness depending upon the desired capacitance over the polysilicon and other portions of the device being fabricated in standard manner. A layer of second polysilicon 11 having a thickness of 2000 Å is then deposited in standard manner over the entire surface of the substrate including over the capacitor dielectric, this layer to result in the upper capacitor plate. As an alternative, the surface of the device being fabricated can be patterned and masked with the second polysilicon layer 11 being deposited only in the patterned regions as shown, this including the capacitor dielectric. A layer of titanium 13 of sufficient thickness to completely silicide the second polysilicon layer is then deposited over the entire device as shown in FIG. 1b and the device is then heated to a temperature of 675° C. for 30 minutes to cause titanium silicide 15 to form in those locations where it rests over polysilicon, this including the top capacitor plate as shown in FIG. 1c. The remaining titanium lies on the surface in unreacted state and is then removed with ammonium hydroxide/hydrogen peroxide mixture of known type which reacts with the elemental titanium but not with the titanium silicide. The result is a capacitor disposed either in the active region or over the field oxide with relatively highly electrically conductive lower and upper plates, despite having a thin upper plate as in the prior art. Fabrication of the device is then completed.

Figure 2A:
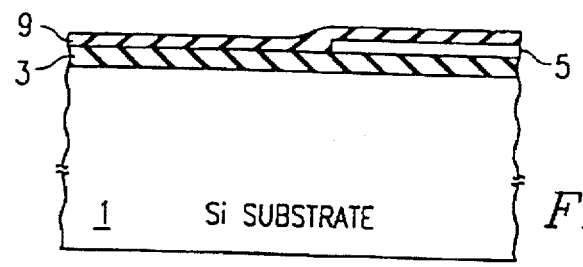
FIGS. 2a to 2e are a process flow in accordance with a second embodiment of the present invention.
Figure 2B:
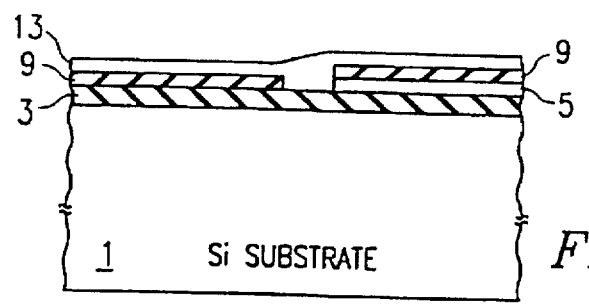
Figure 2C:
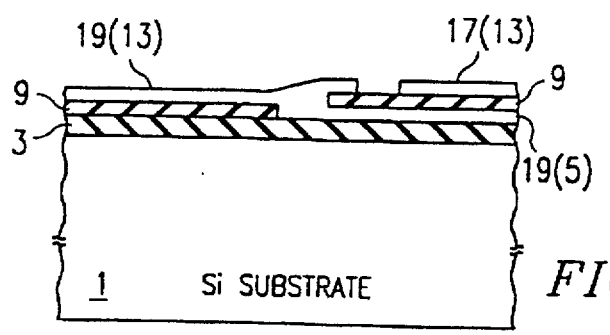
Figure 2D:
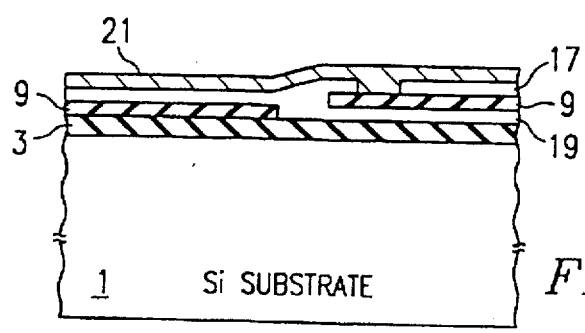
Figure 2E:
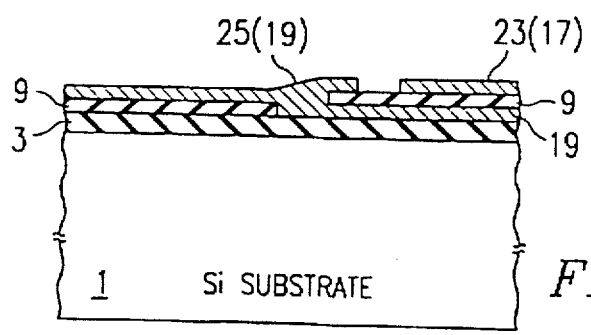

Referring now to FIGS. 2a to 2e, there is shown a second embodiment of an integrated circuit capacitor disposed on the field oxide wherein both capacitor plates extend to the upper surface of the capacitor and are accessible therefrom. In this embodiment, the bottom capacitor plate 5 and the dielectric 9 are formed as in the first embodiment as shown in FIG. 2b. However, the dielectric 9 is then etched so that a portion of the first polysilicon layer 5 is exposed as shown in FIG. 2b. Accordingly, when the second polysilicon layer 13 is deposited, it extends to the lower capacitor plate 5. The second polysilicon layer 13 is then etched to separate the capacitor into an upper plate 17 and a lower plate 19 which extends around the dielectric layer 9 to the upper surface as shown in FIG. 2c. Siliciding then takes place with the deposition of titanium 21 as in the first embodiment as shown in FIG. 2d followed by heating to form the silicide with exposed silicon and removal of unreacted titanium as shown in FIG. 2e.

A resistor in accordance with the present invention is fabricated, with reference to FIG. 1c, by first providing a silicon substrate 1, forming a layer of oxide 3 which is 6 KÅ thick thereover, such as by thermal growth. A layer of polysilicon 5 of predetermined thickness is then deposited over the oxide layer 3 and doped with a phosphorous 31 implant 7 to a predetermined level with $POCl_3$. The polysilicon layer 5 is then patterned and etched in standard manner to leave a heavily doped section of polysilicon 5 as shown in FIG. 1b which can be the bottom plate of the capacitor and is also a resistor, the resistance being determined by the thickness, geometry and doping level of the patterned region. A void 16 is etched and filled with an appropriate conductive material 17 to form an electrical contact for the resistor, it being understood that a corresponding contact is formed at an opposite end (not shown) of the device. At this time in the procedure, any active or passive elements will be fabricated in the active or moat regions of the device being fabricated in standard manner. Such fabrication steps will take place separately or concurrently with the processing of the resistor, this depending upon the processing steps involved and if the same processing steps are called for for both component fabrication in the active or moat region and for capacitor fabrication.

At this time, as shown in FIG. 1b, a dielectric 9 in the form of an oxide or oxide/nitride/oxide and having a thickness depending upon the desired parameters required is deposited over the polysilicon and other portions of the device being fabricated in standard manner. A layer of second polysilicon 11 having a thickness determined by the resistance value desired is then deposited in standard manner over the entire surface of the substrate including over the capacitor dielectric, this layer to result in a resistor and, if desired, the upper capacitor plate. As an alternative, the surface of the device being fabricated can be patterned and masked with the polysilicon layer being deposited only in the patterned regions, this including the dielectric. A layer of titanium 13 of sufficient thickness to completely silicide the second polysilicon layer is then deposited over the entire device as shown in FIG. 1b and the device is then heated to a temperature of 675° for 30 minutes to cause titanium silicide 15 to form in those locations where it rests over polysilicon, this including the top capacitor plate as shown in FIG. 1c. The remaining titanium lies on the surface in unreacted state and is then removed with ammonium hydroxide/hydrogen peroxide mixture of known type which reacts with the elemental titanium but not with the titanium silicide. The result is a pair of resistors and a capacitor disposed either in the active region or over the field oxide with the capacitor having relatively highly electrically conductive lower and upper plates, despite having a thin upper plate as in the prior art. Fabrication of the device is then completed.

Referring now to FIGS. 2a to 2e, there is shown a second embodiment of an integrated circuit resistor and capacitor disposed on the field oxide wherein both resistors and/or capacitor plates extend to the upper surface of the capacitor and are accessible therefrom. In this embodiment, the bottom resistor/capacitor plate 5 and the dielectric 9 are formed as in the first embodiment as shown in FIG. 2b. However, the dielectric 9 is then etched so that a portion of the first polysilicon layer 5 is exposed as shown in FIG. 2b. Accordingly, when the second polysilicon layer 13 is deposited, it extends to the lower resistor/capacitor plate 5. The second polysilicon layer 13 is then etched to separate the resistors/capacitor into an upper resistor 17 and a lower resistor 19 which extends around the dielectric layer 9 to the upper surface as shown in FIG. 2c. Siliciding then takes place with the deposition of titanium 21 as in the first embodiment as shown in FIG. 2d followed by heating to form the silicide with exposed silicon and removal of unreacted titanium as shown in FIG. 2e.

As is shown in FIGS. 1b'–1d', transistors can be formed in the active region in each of the above described embodiments by formation of a region containing a gate oxide 9 as one of the steps required during resistor and/or capacitor formation with the second polysilicon layer 13 being deposited over the gate oxide to provide the gate of the transistor.

Figures 1, 1D:
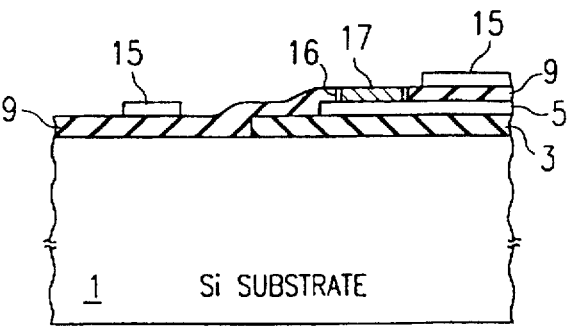

Appropriate metallization 15, such as titanium silicide, (FIG. 1d') is now provided to couple the capacitors and/or resistors to circuitry within the moat or to circuitry external to the moat, as required, in standard manner.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of making an integrated circuit comprising the steps of:
   (a) providing a semiconductor substrate having an active surface region and an inactive surface region defining said active region;
   (b) forming a first layer of heavily doped polysilicon on said inactive region having a doping level of from about 10 ohms/square to about 15 ohms/square;
   (c) forming a layer of electrically insulating material over said first layer of heavily doped polysilicon;.
   (d) forming a layer of metal silicide over said layer of electrically insulating material by forming a thin second layer of polysilicon on said electrically insulating material, forming a layer of metal reactive with silicon reacting said layer of metal reactive with silicon to completely silicide said second layer of polysilicon and removing unreacted metal; and
   (e) forming a resistor in said first layer by forming contacts at opposing ends of said first layer.

2. The method of claim 1 further including the step of forming a capacitor from said first layer and said layer of metal silicide by forming contacts on said first layer and on said layer of metal silicide.

3. The method of claim 2 wherein said layer of electrically insulating material exposes a portion of said first layer and said layer of metal silicide contacts said exposed portion of said first layer, the portion of said layer of metal silicide contacting said first layer being electrically isolated from a predetermined other portion of said layer of metal silicide.

4. The method of claim 1 further including the step of forming a transistor in said active region by the steps of forming a layer of electrically insulating material over said substrate in said active region and also forming a portion of said second layer of polysilicon in said active region over said layer of electrically insulating material.

5. The method of claim 1 further including the step of forming a transistor in said active region by the steps of forming a layer of electrically insulating material over said substrate in said active region and also forming a portion of said second layer of polysilicon in said active region over said layer of electrically insulating material.

6. The method of claim 2 further including the step of forming a transistor in said active region by the steps of forming a layer of electrically insulating material over said substrate in said active region and also forming a portion of said second layer of polysilicon in said active region over said layer of electrically insulating material.

7. The method of claim 3 further including the step of forming a transistor in said active region by the steps of forming a layer of electrically insulating material over said substrate in said active region and also forming a portion of said second layer of polysilicon in said active region over said layer of electrically insulating material.

* * * * *